(12) United States Patent
Hu et al.

(10) Patent No.: US 9,293,449 B2
(45) Date of Patent: Mar. 22, 2016

(54) METHODS AND APPARATUS FOR PACKAGE ON PACKAGE DEVICES WITH REVERSED STUD BUMP THROUGH VIA INTERCONNECTIONS

(71) Applicant: Taiwan Semiconductor Manufacturing Company, Ltd., Hsin-Chu (TW)

(72) Inventors: Shou-Cheng Hu, Tai-Chung (TW); Chen-Shien Chen, Zhubei (TW); Tin-Hao Kuo, Hsin-Chu (TW); Chih-Hua Chen, Zhubei (TW); Ching-Wen Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/546,777

(22) Filed: Nov. 18, 2014

(65) Prior Publication Data
US 2015/0072476 A1    Mar. 12, 2015

Related U.S. Application Data

(62) Division of application No. 13/444,674, filed on Apr. 11, 2012, now Pat. No. 8,922,005.

(51) Int. Cl.
*H01L 21/44* (2006.01)
*H01L 25/00* (2006.01)
(Continued)

(52) U.S. Cl.
CPC .......... *H01L 25/50* (2013.01); *H01L 23/49816* (2013.01); *H01L 23/5389* (2013.01); *H01L 24/11* (2013.01); *H01L 24/19* (2013.01); *H01L 24/20* (2013.01); *H01L 24/81* (2013.01); *H01L 25/105* (2013.01); *H01L 25/0657* (2013.01);
(Continued)

(58) Field of Classification Search
CPC ..... H01L 24/11; H01L 24/81; H01L 23/5389; H01L 23/49811
USPC ............................ 438/127, 613; 257/E21.502
See application file for complete search history.

(56) References Cited

U.S. PATENT DOCUMENTS

| 4,807,021 A | 2/1989 | Okumura |
| 5,715,144 A | 2/1998 | Ameen et al. |

(Continued)

FOREIGN PATENT DOCUMENTS

| KR | 1020050001159 | 1/2005 |
| KR | 100961310 | 6/2010 |

*Primary Examiner* — Nitin Parekh
(74) *Attorney, Agent, or Firm* — Slater & Matsil, L.L.P.

(57) ABSTRACT

Methods and apparatus for package on package structures having stud bump through via interconnections. A structure includes an interconnect layer having a plurality of through via assemblies each including at least one stud bump are formed on conductive pads; and encapsulant surrounding the through via assembly, a first redistribution layer formed over a surface of the encapsulant and coupled to the through via assemblies and carrying connectors, and a second redistribution layer over interconnect layer at the other end of the through via assemblies, the through via assemblies extending vertically through the interconnect layer. In an embodiment the interconnect layer is mounted using the connectors to a lower package substrate to form a package on package structure. A first integrated circuit device may be mounted on the second redistribution layer of the interconnect layer. Methods for forming the interconnect layer and the package on package structures are disclosed.

20 Claims, 9 Drawing Sheets (51) Int. Cl.
  *H01L 23/538* (2006.01)
  *H01L 23/00* (2006.01)
  *H01L 25/10* (2006.01)
  *H01L 23/498* (2006.01)
  *H01L 25/065* (2006.01)

(52) U.S. Cl.
  CPC . *H01L 2224/0231* (2013.01); *H01L 2224/0401* (2013.01); *H01L 2224/04105* (2013.01); *H01L 2224/11002* (2013.01); *H01L 2224/11003* (2013.01); *H01L 2224/1134* (2013.01); *H01L 2224/12105* (2013.01); *H01L 2224/45144* (2013.01); *H01L 2224/45147* (2013.01); *H01L 2224/73267* (2013.01); *H01L 2225/06541* (2013.01); *H01L 2225/06565* (2013.01); *H01L 2225/1035* (2013.01); *H01L 2225/1058* (2013.01); *H01L 2924/00014* (2013.01); *H01L 2924/01047* (2013.01); *H01L 2924/01322* (2013.01); *H01L 2924/12042* (2013.01); *H01L 2924/14* (2013.01); *H01L 2924/15311* (2013.01); *H01L 2924/181* (2013.01)

(56) References Cited

U.S. PATENT DOCUMENTS

| | | | |
|---|---|---|---|
| 6,335,491 B1 | 1/2002 | Alagaratnam et al. | |
| 6,555,917 B1 | 4/2003 | Heo | |
| 7,687,904 B2 | 3/2010 | De Raedt et al. | |
| 7,790,504 B2 | 9/2010 | Ramakrishna et al. | |
| 8,012,776 B2 * | 9/2011 | Derderian | 438/25 |
| 8,084,302 B2 * | 12/2011 | Do et al. | 438/127 |
| 8,093,702 B2 | 1/2012 | Lua et al. | |
| 8,193,646 B2 | 6/2012 | Wood et al. | |
| 8,378,477 B2 * | 2/2013 | Do et al. | 257/686 |
| 8,866,285 B2 | 10/2014 | Hu et al. | |
| 2002/0017710 A1 | 2/2002 | Kurashima et al. | |
| 2002/0066952 A1 | 6/2002 | Taniguchi et al. | |
| 2003/0013969 A1 | 1/2003 | Erikson et al. | |
| 2004/0262774 A1 | 12/2004 | Kang et al. | |
| 2005/0200009 A1 | 9/2005 | Kang et al. | |
| 2006/0121718 A1 * | 6/2006 | Machida et al. | 438/612 |
| 2007/0013067 A1 | 1/2007 | Nishida et al. | |
| 2007/0279077 A1 | 12/2007 | Yabuki et al. | |
| 2008/0224306 A1 | 9/2008 | Yang | |
| 2009/0045496 A1 | 2/2009 | Tian et al. | |
| 2009/0050994 A1 * | 2/2009 | Ishihara et al. | 257/432 |
| 2009/0224402 A1 | 9/2009 | Do et al. | |
| 2009/0303690 A1 | 12/2009 | Lee et al. | |
| 2009/0321926 A1 | 12/2009 | Nakamura et al. | |
| 2010/0140783 A1 | 6/2010 | Do et al. | |
| 2011/0074023 A1 * | 3/2011 | Supriya | H01L 24/27 257/737 |
| 2011/0312133 A1 * | 12/2011 | Park | H01L 21/565 438/122 |
| 2012/0038040 A1 | 2/2012 | Jang et al. | |
| 2012/0153507 A1 * | 6/2012 | Miki | H01L 21/568 257/782 |
| 2012/0228767 A1 | 9/2012 | Lee et al. | |
| 2013/0075937 A1 * | 3/2013 | Wang et al. | 257/782 |
| 2013/0130443 A1 * | 5/2013 | Lu et al. | 438/113 |
| 2013/0270682 A1 | 10/2013 | Hu et al. | |
| 2014/0061937 A1 | 3/2014 | Hu | |

* cited by examiner

METHODS AND APPARATUS FOR PACKAGE ON PACKAGE DEVICES WITH REVERSED STUD BUMP THROUGH VIA INTERCONNECTIONS

This application is a divisional application of patent application Ser. No. 13/444,674, entitled "Methods and Apparatus for Package on Package Devices with Reversed Stud Bump Through Via Interconnections," filed on Apr. 11, 2012, which application is incorporated herein by reference.

BACKGROUND

As devices manufactured using integrated circuits continue to shrink, the need for smaller packages for the integrated circuit devices continues to increase. One approach increasingly used to save space on a system circuit board and to reduce the board area used is to provide two or more integrated circuits in a combined, vertically arranged package structure called a "Package on Package" or "PoP" device. The PoP structure reduces the system board area that would otherwise be needed, and also eliminates the need for some of the connector traces on the circuit board that would otherwise connect the devices to each other. Through via connections may be used to provide electrical connections between the vertically arranged packaged devices.

For example, a memory module may be mounted as the upper package in a PoP structure. The memory module could include one, two or more commodity memory devices such as DDR DRAM, SRAM or FLASH devices, as non-limiting examples. In a conventional PoP structure, the upper package substrate may be a multiple level circuit board, and may be formed of a resin, such as glass reinforced epoxy resin, FR4, BT resin, ceramic, plastic, film, or other substrate materials including those with woven glass fiber cores in a resin material.

The bottom surface of the upper substrate may have one or more rows of PoP connectors extending vertically away from the bottom surface of the top substrate. These PoP connectors provide the connections from the memory module to either the integrated circuit mounted on the bottom package of the PoP device, or, to connections that will be mapped to the system board when the PoP device is finally mounted on the system circuit board. Typically these PoP connectors are solder balls. Solder balls have a certain minimum size and also a minimum required spacing between the balls (minimum pitch). The characteristics of the conventional solder balls as PoP connectors limit the thinness of the resulting structure, and also limit the number of input/output connections to the upper package that can be supported without enlarging the area of the PoP structure.

The bottom package is a substrate that also has at least one integrated circuit mounted on it. The upper surface of the bottom package has lands or pads for receiving and electrically connecting to the PoP connectors. For example, if the PoP connectors are rows of solder balls, lands or pads on the upper surface of the bottom package will correspond to, and receive, those connectors.

The bottom substrate of the PoP will also have external connectors for making the final connection between the PoP structure and the system circuit board. The bottom package may be a ball grid array ("BGA") type package and have solder balls arranged in an array on the bottom surface.

As the number of input-output connections to the devices in the PoP structure increases, up to and including so-called "wide I/O" devices which may have greater than 1200 connections, PoP structures formed using conventional approaches either have to be increased in board area, and/or increased in thickness, to provide the needed connections. Use of the conventional solder balls as the PoP connectors between the upper and lower packages also limits the package thinness that can be achieved.

BRIEF DESCRIPTION OF THE FIGURES

For a more complete understanding of the present disclosure, and the advantages thereof, reference is now made to the following descriptions taken in conjunction with the accompanying drawings, in which.

The drawings, schematics and diagrams are illustrative and not intended to be limiting, but are examples of embodiments of the disclosure, are simplified for explanatory purposes, and are not drawn to scale.

DETAILED DESCRIPTION

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed concepts of the application, and do not limit the scope of the disclosure and do not limit the scope of the appended claims.

Embodiments of the present application, examples of which are now described in detail, provide novel methods and apparatus for PoP structures with interconnection layers formed using stud bump vertical connections, referred to as "through via assemblies" or "TVAs". In an embodiment, an interconnection layer includes a plurality of reversed stud bump stacks as TVAs formed to provide vertical connections within and through the interconnection layer. The reversed stud bump stacks may be surrounded by an encapsulant such as a resin, epoxy, or mold compound. In a typical orientation of the finished POP package using the embodiments, the stud portion of the reversed stud bump or bumps is oriented towards the top of the POP package, and the neck or tail extending from it extends downwards towards the system board. This is considered a "reversed" stud bump when compared to conventional wire bond bumps. The interconnection layer may also include a flip chip application processor or "AP" device. Redistribution layers ("RDLs") are formed on both the upper and lower surfaces of the interconnection layer. On the upper surface a first integrated circuit device can be mounted, either by a flip chip arrangement, by a wire bond arrangement, or a combination. The first integrated circuit device may be a module. A lower package substrate is provided and the interconnect layer may be positioned on the lower package substrate to form a PoP structure. The lower package substrate may have lands or pads that may be coupled at its upper surface by connectors on the lower surface of the novel interconnection layer. The lower package of the PoP structure may be a PCB board or other substrate such as a woven glass reinforced epoxy resin. Additional redistribution layers may be formed on the upper and lower surfaces of the lower package. External connectors such as ball grid array connectors may be provided on the lower surface of the lower package substrate for coupling the PoP structure to a system board. If the application processor and the first integrated circuit device form a system, such as an example application processor ("AP") that is a microprocessor and an example memory module coupled to the AP as cache memory, then the PoP structure may be a System in Package ("SIP") device.

In an alternative embodiment, a PoP structure again includes a first integrated circuit device mounted on the upper surface of an interconnect layer. In this alternative embodiment, through via assemblies forming the vertical connections of the interconnect layer are formed using reversed stud bumps with wire tails extending from the stud bumps downwardly or away from the upper surface. Encapsulant such as a molding compound surrounds and protects the TVAs including the reversed stud bumps and wire tails. Again, an application processor may be flip chip mounted in the interconnect layer and it too may be encapsulated. A lower package substrate has lands that may be coupled to the interconnect layer in a PoP structure, and may be coupled to the interconnect layer by solder bumps, copper bumps, or copper pillars, or the like. The lower package may be a substrate such as a FR4 core or other similar substrate with upper and lower redistribution layers on it, and may include external connectors such as a ball grid array or solder balls configured to connect the PoP structure to a system board.

Figure 1:
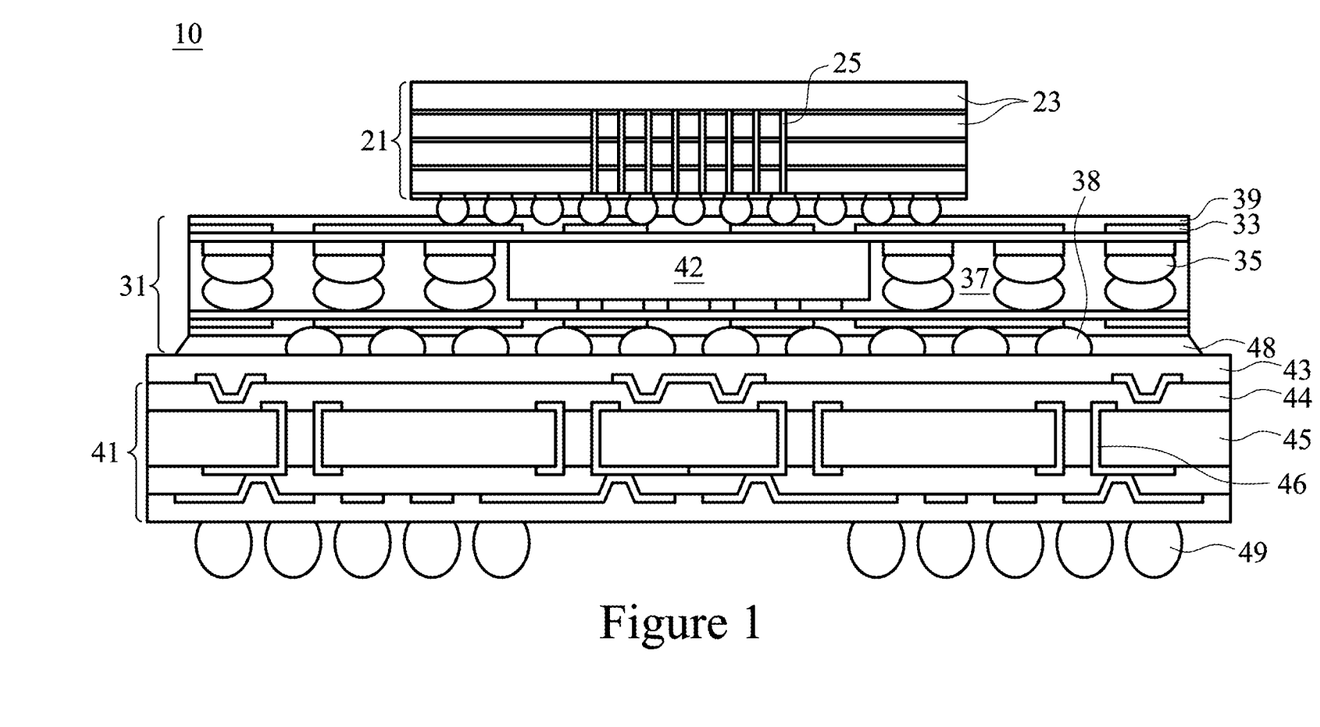
FIG. 1 depicts in a cross-sectional view an embodiment PoP structure.

FIG. 1 depicts in a cross-sectional view a first embodiment PoP structure 10. The embodiment 10 includes a module 21 of several integrated circuits 23 that are shown, in this example, in a stacked die arrangement. The dies may be coupled by vertical through via connectors 25. A plurality of connectors 27 then couple module 21 to the upper surface of an interconnect layer 31. The connectors 27 may be solder bumps, copper bumps or pillars, or other connectors. In an alternative embodiment, the module 21 may be formed of one or more face up integrated circuits arranged in a wire bond connection to the interconnect layer 31. The module 21 may be one or more memory devices such as DRAM, FLASH or SRAM devices or a combination of types. The memories may be commodity devices such as dual data rate ("DDR") DRAMs. The module 21 may be coupled with an application processor 42, described further below, in the PoP structure 10, to form a system.

Interconnect layer 31 provides the vertical connections for the PoP structure 10. In this embodiment a plurality of through via assemblies 35 ("TVAs") are formed of stacked reversed stud bump connectors. The reversed stud bump connectors may be formed using ball bonding equipment such as is used for wire bonding. The reversed stud bump connectors may be formed of copper or gold, for example. The reversed stud bumps are stacked one atop another as described in detail below to provide the TVAs 35. The stud bumps are referred to as "reversed" stud bumps because in the embodiments, they are oriented with the stud portion formed adjacent the base pad and directed upwards towards the upper portion of the POP structure, while the neck portion of the stud bumps extends towards the lower portion of the POP structure, in a reverse position when compared to conventional stud bumps. While two reversed stud bumps are illustrated in this non-limiting example, more reversed stud bumps may be stacked to provide the TVAs 35. The reversed stud bumps are stacked to provide the height needed. Molding compound 37 surrounds the TVAs 35 and provides protection and mechanical support for the stacks of reversed stud bumps. Application processor ("AP") 42 is an integrated circuit shown flip chip mounted and also encapsulated by the molding compound 37. AP 42 may be any integrated circuit and may be an application processor such as a microprocessor, a digital signal processor, a general purpose processor, or an application specific integrated circuit ("ASIC"), for example. The application processor 42 may be coupled with module 21 to form a system-in-package ("SIP"). The interconnect layer 31 includes redistribution layers ("RDLs") 33 and 39 on the upper and lower surfaces for coupling to the module 21 (on the upper redistribution layer) and to the lower package 41, described below. Solder connectors 38 provide connections to the lower package 41 and to the interconnect layer 31. These may be solder bumps, or other connectors such as copper bumps, copper pillars, micro-bumps and the like. An underfill material 48 protects and surrounds the solder connectors 38. Note that the term "solder" in this disclosure includes, for example, lead containing and lead free solder materials, including lead free compositions such as SnAgCu ("SAC") and eutectic materials. Lead-tin compositions and other lead containing solder material may be used.

A lower package 41 supports the interconnect layer 31 and provides external connection to the system. The lower package 41 includes redistribution layers 44 on a core 45, and solder mask material 43 is shown over the redistribution layers. External connectors 49 provide electrical connection for coupling to a system board. These external connectors 49 may be solder. In the example shown these connectors 49 may be solder balls arranged in an array or grid covering the bottom of package 41, which may be referred to as a "ball grid array" package or "BGA". Through vias such as 46 are formed having conductors lining or filling a via hole or opening, and these couple vertically conductive traces on the upper and lower surfaces of the lower package 41. The external connectors 49 can be used to couple the application processor 42 and the module 21 to a system board.

Use of the PoP structure 10 to couple the AP 42 and module 21 to each other in a vertical space minimizes the surface area on the system board that would otherwise be required to mount the two components 42 and 21. Further, additional area is saved because many interconnections made between the AP 42 and module 21 are made in the PoP structure, and these traces are not formed on the system board. In addition, by packaging components that functionally communicate together in the PoP structure, signal lengths between these are kept short and thus faster speeds and higher performance may result.

Figure 2:
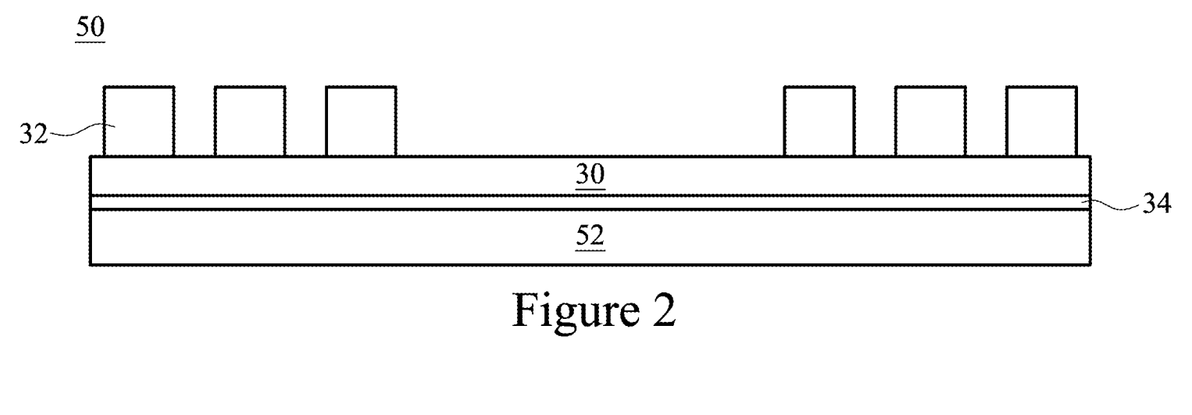
FIG. 2 depicts in a cross-sectional view an intermediate processing step for making an embodiment PoP structure.

FIG. 2 depicts in a cross-sectional view an intermediate product 50 illustrating an embodiment process for forming interconnect layer 31. The embodiments of the novel interconnection layers described herein may be formed using "wafer level processing" or "WLP". In WLP, many units are manufactured simultaneously on a substrate that may be wafer sized. WLP may use conventionally available wafer handling tools, wafer grinding tools, curing ovens and the like that are sized for semiconductor wafers. However, the embodiments may also be formed without using wafer level processing. Using WLP allows many units to be made in a single processing step for several of the processes, saving time, and thereby increasing output.

In FIG. 2, a resin coated copper ("RCC") layer 30 or resin coated foil layer is provided, and the bottom surface of the resin is temporarily attached to carrier 52 by tape or adhesive 34 for supporting the RCC during processing. For WLP the carrier 52 may be sized as a semiconductor wafer, for example 8 inches in diameter, 12 inches in diameter, and so on. The carrier 52 may be glass, ceramic, alumina, stainless steel or another material that provides adequate temporary support for the RCC 30 during processing.

In one embodiment, the RCC 30 is coated with copper foil that is between 0.25 microns and 18 microns thick. Other thicknesses may be used. The copper is patterned, for example using photolithography and etch processes, to form copper pads 32 over the RCC 30. In an alternative embodiment, an aluminum layer may be coated with the resin to form the metal over pads 32 RCC 30. The aluminum has advantages in some applications where a surface finish layer is not required, as described further below. For WLP or other gang assembly methods, the RCC 30 will include many individual units that are to be separated in a later step, although only a portion of one of the units is shown in the figures.

Figure 3:
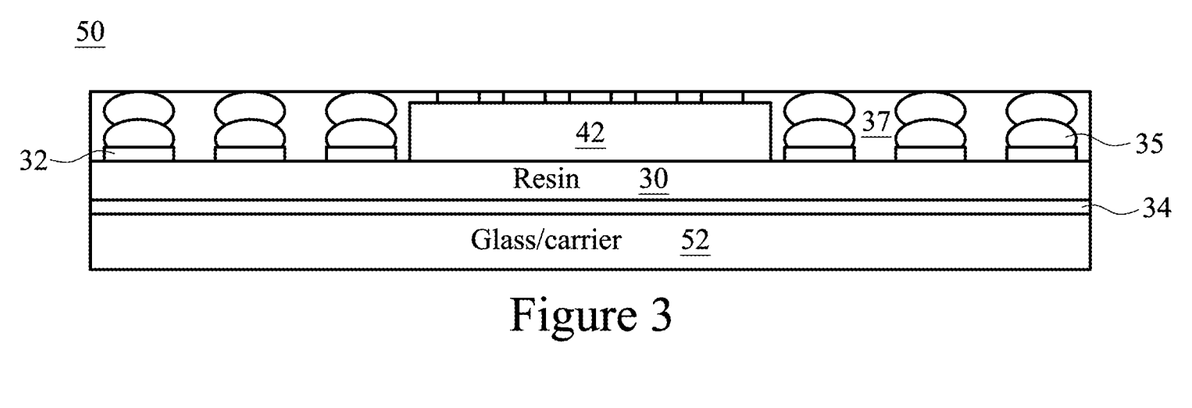
FIG. 3 depicts in a cross-sectional view the embodiment PoP structure of FIG. 2, following additional processing.

FIG. 3 depicts in another cross-sectional view the intermediate product 50 following additional processing steps. In transitioning from FIG. 2 to the illustration of FIG. 3, several steps are performed. AP 42 was attached to the resin 30 using a die attach process on the backside of the die. A die attach adhesive may be used. A die attach film may also be used to attach AP 42. The AP 42 has conductive bond pads that are now facing upwards as oriented in this illustrative example. In one embodiment, the bond pads of AP 42 may include Cu post or pillar bumps that are coated by a passivation layer. By providing a planar surface for the pad side of AP 42, this approach makes the use of die pick and place equipment tools easier, as the surface of AP 42 is easy for the pick and place tools to attach to.

After mounting AP 42 to resin 30, a ball bumping process is performed to form the reversed stud bump TVAs 35. A wire bonding capillary tool may be used for example, with a copper or gold wire to perform ball bonding on each of the pads 32. By applying heat to the end of a wire, the wire bonding tool forms a ball at the end of a wire extending through a capillary. The wire bonding tool, which may be automated, then punches the wire bonding ball onto a selected pad 32 and deposits the ball and forms the first reversed stud bump, using mechanical pressure, vibration, and sometimes ultrasonic energy to bond the reversed stud bump to the pad 32. In this embodiment, the bond wire is then cut very near the pad and another reversed stud bump is formed atop the first reversed stud bump. The second reversed stud bump is stacked atop the first reversed stud bump to form the TVAs 35 as a reversed stud bump stack. The height of the TVAs 35 needs to be sufficient to be greater than or approximately equal to the thickness of the AP 42. The height of the TVAs is selected so that the top of the TVA 35 will be at least as high as the bond pads on the surface of AP 42. Although in the non-limiting examples provided herein, two reversed stud bumps are shown in the TVAs 35, additional stud bumps could be added to the stack of stud bumps to form TVAs 35; if needed, for additional height.

Following the completion of the ball bonding operations to form the reversed stud bump TVAs 35 on all of the pads 32, an encapsulant is formed to surround the reversed stud bump TVAs 35 and the AP 42. This may be done, for example, by using a compression transfer molding step using thermoset epoxy molding compound. Other resins and encapsulants may be used to form the encapsulant. A thermal cure or UV cure may be used to harden the encapsulant. Resins could be used for the encapsulant.

Figure 4:
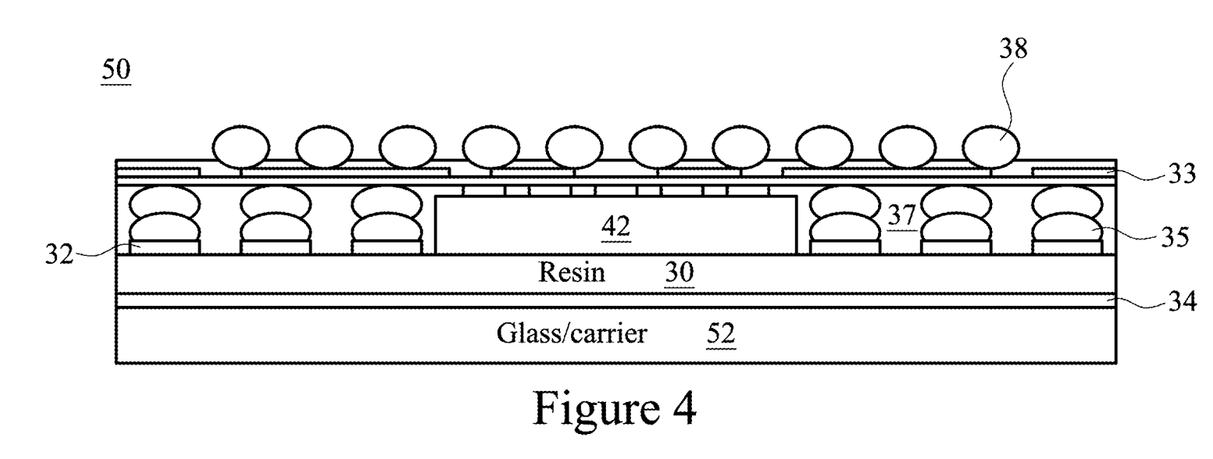
FIG. 4 depicts in a cross-sectional view the embodiment PoP structure of FIG. 3, following additional processing.

FIG. 4 depicts in a cross-sectional view the intermediate product 50 following additional process steps. Following the encapsulating process, a wafer grinding process can be applied to the molding compound 37. The grinding continues and removes at least a portion of the molding compound from the upper surface of the TVAs 35 and from the bond pads. The wafer grinding continues until it exposes at least a portion of the upper surface of the TVAs 35 and the bond pads located on AP 42. Following the wafer grinding step, a redistribution layer ("RDL") 33 may be formed over the surface of the mold compound 37. RDL 33 may include layers of dielectrics and conductors such as copper traces. The RDL 33 may map the upper surface of the TVAs 35, and the bond pads of the AP 42, to pad locations on the upper surface of RDL 33 for receiving a solder bump or other electrical connection. The connectors 38, which may be controlled collapsing chip connectors ("C4"), solder bumps, or other connectors for flip chip assembly, are then formed on the surface of the RDL 33, which is illustrated in this non-limiting example as oriented on top of the structure, although the operations could be performed with the intermediate product 50 in another orientation, such as face down.

Figure 5:
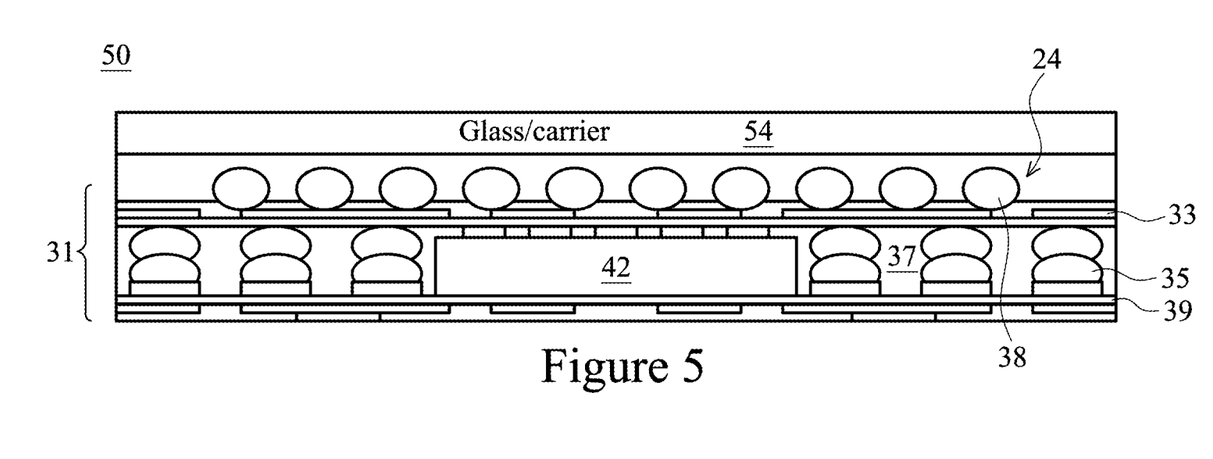
FIG. 5 depicts in a cross-sectional view the embodiment of FIG. 4, following additional processing.

FIG. 5 depicts in a cross-sectional view the final processing for completing interconnect layer 31. In transitioning from the intermediate product 50 of FIG. 4 to the interconnect layer 31 as shown in FIG. 5, several steps are performed. A demounting step is performed to remove the carrier 52 from the resin 30. Now an adhesive or tape 24 is applied to upper side over the solder connectors 38 and again, a temporary fitting is made to a carrier 54, now on the top side of the structure. Again the orientation in the figures is shown for purposes of illustration only, and the process could be performed with the structure oriented in another direction.

An additional wafer grinding step is then performed to remove the resin 30. The wafer grinding exposes a surface of the copper pads 32 for each TVA 35. Thus, the TVAs 35 now form vertical connections extending through the interconnect layer 31 from the upper surface to the lower surface. Following the grinding operation, a second RDL 39 is formed on the pads 32, on the bottom surface as shown in FIG. 5. This RDL 39 makes electrical connection to the pads 32 and provides lands for solder connections such as solder bumps.

Figure 6:
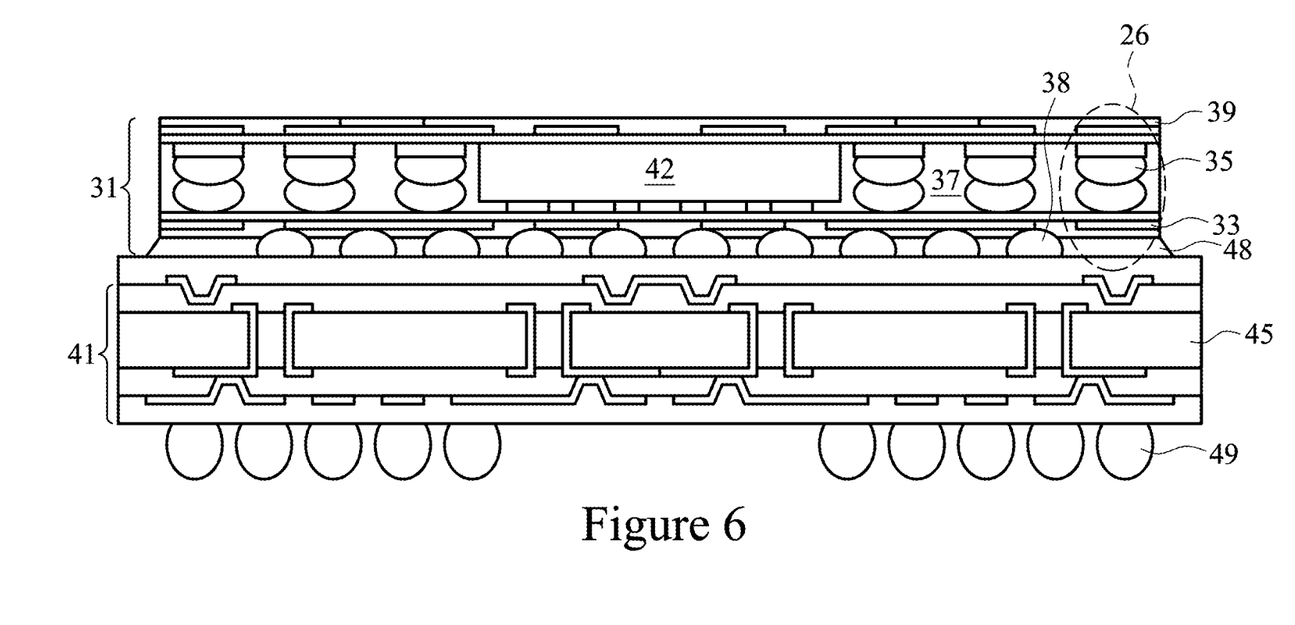
FIG. 6 depicts in a cross-sectional view the embodiment of FIG. 5, following additional processing.

FIG. 6 depicts the interconnect layer 31 mounted to a lower package substrate 41. To transition from the intermediate product illustrated in FIG. 5 to the assembly shown in FIG. 6, several more processing steps were performed. The carrier 54 was demounted from the interconnect layer 31 which now includes upper and lower RDL layers 33 and 39. If a wafer level processing approach is used to fabricate the interconnect layer 31, a singulation step is performed to separate the plurality of assemblies into individual units for further assembly. This may be done by mechanical scribing or sawing, laser sawing, or a combination of these.

After the individual units are separated from one another, the interconnect layer 31 may then be flipped over so that the TVAs 35 are "reversed' in orientation and the solder connectors 38 are positioned facing the lower package 41. Thus the stud bumps 35 are now oriented in a "reversed" position. This flipping step may be done using automated pick and place tools, for example. The interconnect 31 is now mounted on the lower package 41. Lower package 41 includes lands or pads on its upper surface for flip chip bonding, and the solder connectors 38 are bonded to the lower package 41.

In one example embodiment method, a thermal reflow process may be used. An underfill layer 48 such as a capillary underfill may be used to protect solder connectors 38. A capillary underfill process uses a liquid material that flows beneath the interconnect layer 31 and surrounds the solder connectors 38 through a capillary action, then the underfill material may be cured by thermal or UV energy to harden the material 48. Other underfill materials could also be used, such as molded underfill layers.

As described with respect to FIG. 1 above, the lower package 41 provides support for the interconnect layer 31 and provides additional electrical connection through the external connectors 49 to the system board. The lower package 41 is shown in this example is based on an epoxy resin substrate such as an FR4 substrate; however, alternatives such as silicon interposers could be used as the substrate as well. Through vias 46 and multiple layer circuit conductors in lower package 41 may provide additional connectivity and support circuit remapping functions, for example.

Figure 7:
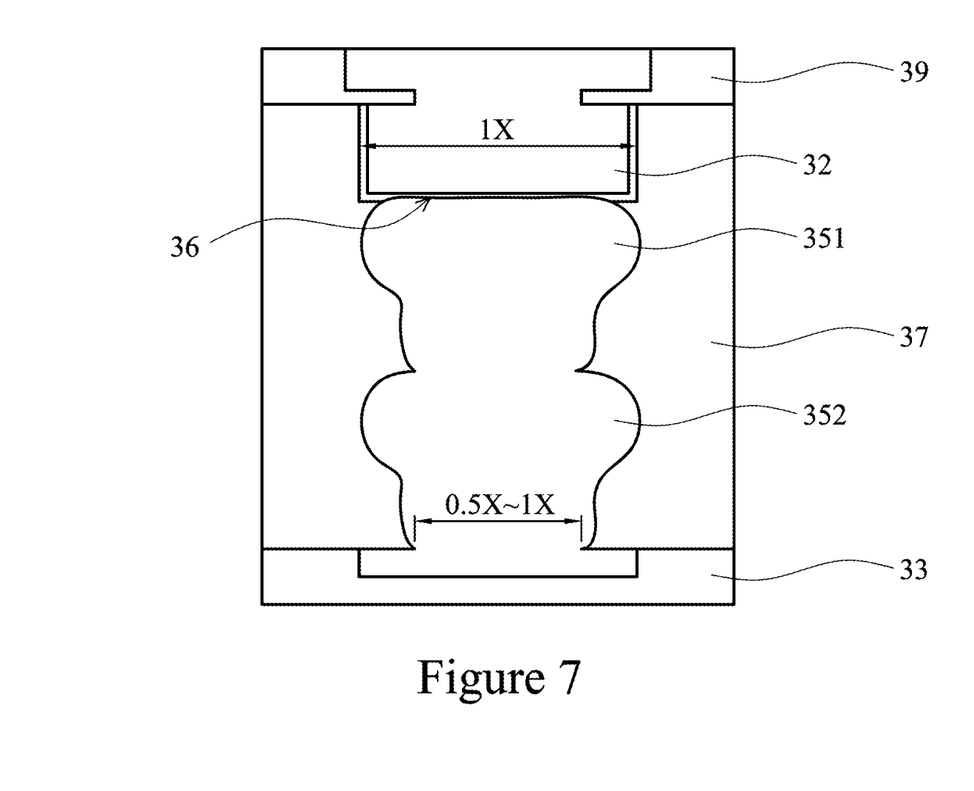
FIG. 7 depicts in a cross-sectional view a through via assembly of an embodiment.

FIG. 7 depicts in a cross-sectional view the through via assembly 35 of the embodiment interconnect layer 31 described above. In FIG. 7, use of the embodiment interconnect layer 31 using reversed stud bump TVAs as the through vias has several advantages over conventional PoP structures using, for example, solder ball connections mounted on substrates as through via connections. The PoP structure achieved using the embodiments can be thinner (lower height) than the conventional PoP structure. The reversed stud bump TVAs 35 are produced using wire ball bonding technology and equipment, which is widely available and very economical. No special under bump metallization ("UBM") is needed for the TVAs. The TVAs 35 are formed from copper or gold bond wire and the interconnect layer 31 uses mold compound and bond wire as materials. These materials are commonly used in semiconductor packaging and are very economical. WLP may be used to further reduce costs and increase throughput for manufacturing the PoP structures. The PoP structure 10 has fine pitch and may support the use of wide I/O devices of greater than 1200 I/O connections in a chip scaled package ("CSP"). An area 26 for further illustrating the features is depicted in a close up detail view in FIG. 7.

FIG. 7 depicts in a cross-sectional view area 26 of FIG. 6 in a closer view. In FIG. 7, the TVA assembly 35 is shown as including reversed stud bumps 351 and 352 that are stacked vertically on pad 32. A finish plate 36 on pad 32 may include nickel, nickel/gold, or other platings for copper stud bumping processes including, without limitation, ENIG (electro less nickel immersion gold) ENEPIG (electro less nickel, electro less palladium, immersion gold), palladium, silver, nickel palladium, and the like. Note that as mentioned above, if the resin coated carrier 30 was aluminum layer with resin coating, then the surface finish steps described for the copper pads 32 may be omitted, as the pads 32 would then be of aluminum. The width of the reversed stud bumps 351, 352 tapers from the attachment point, also referred to herein as a base region, as the reversed stud bumps extend downward in FIG. 7 and at the narrowest point the neck portion, also referred to herein as a tail region, may be between 0.5× and 1× the width of the pad 32. In contrast to solder on pad arrangements, the pitch of the TVAs 35 is similar to the pad pitch and no extra pitch is required to avoid shorts or interference. Because the stud bump stack in the TVAs is oriented "upside down", when drawn in this manner TVA 35 may be referred to as a "reversed stud bump" assembly. However, the orientations in the illustrations are arbitrary and other orientations may be used.

The assembly of FIG. 6, the interconnect layer 31 and the lower package 41, forms a PoP structure that is ready for testing. Using functional and connectivity tests to exercise the AP 42, and using tests to confirm the mechanical and electrical connections of the external connectors 49 to the interconnect layer 31 and the lower package 41, a known good package ("KGP") status may be determined. By performing KGP tests on the assemblies prior to mounting the upper devices, a module such as 21 in FIG. 1 may only be mounted on "known good" PoP structures. Because modules 21 are not mounted on defective PoP structures, waste and yield loss are reduced; further lowering costs.

Figure 8:
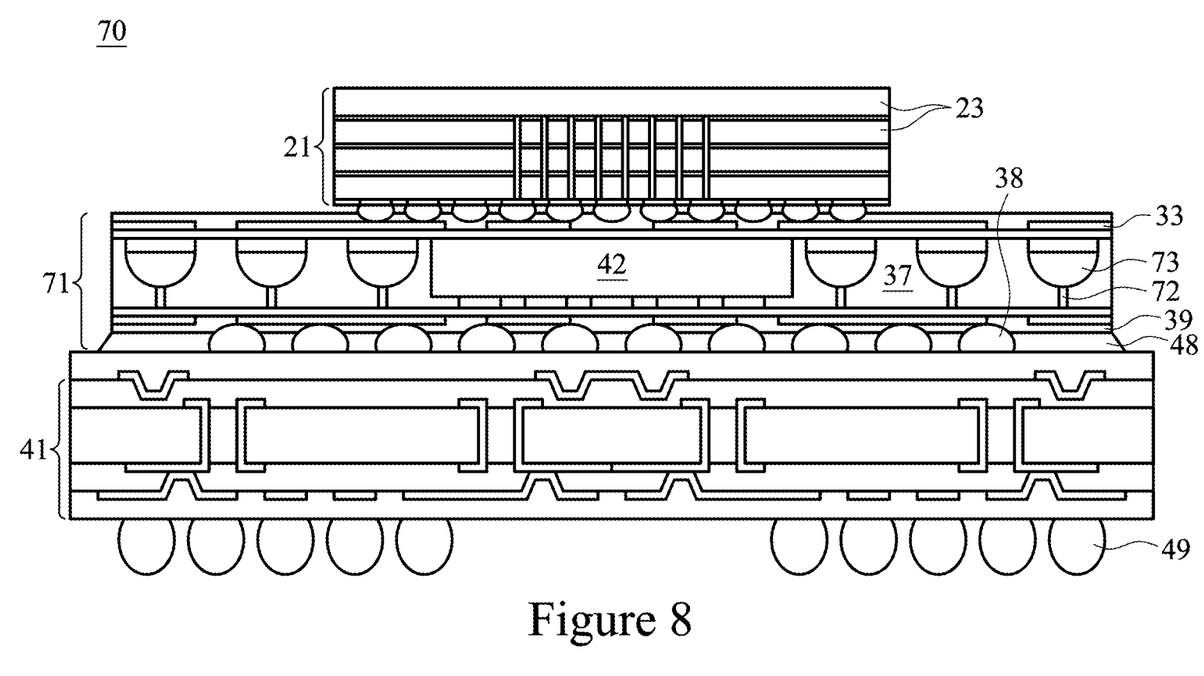
FIG. 8 depicts in a cross-sectional view another embodiment PoP structure.

FIG. 8 depicts in a cross-sectional view another alternative embodiment PoP structure 70. In this alternative embodiment, many elements are shown that are shown in FIG. 1, above, and like reference numerals are used for like elements.

In FIG. 8, the interconnection layer is numbered 71 to distinguish this embodiment from that illustrated as 31 above. Mold compound 37 and AP 42 are the same as in FIG. 1. Further, in FIG. 8 the module 21, which may be a stack of integrated circuits 23, is the same as in FIG. 1 and is not further described here. Also, the lower package 41 is the same as in FIG. 1 and other figures presented above, and it also is not further described here.

FIG. 8 depicts an interconnect layer 71 with a reversed stud bump TVA formed of a single reversed stud bump 73 on a copper pad, and an extending wire forming "tail" 72. This TVA is again formed using a ball bond tool in a wire bonding system. However, instead of stacked reversed stud bumps like the embodiments illustrated in the figures above, after the reversed stud bump 73 is formed, a vertical wire 72 is dispensed during the wire bonding, and then the wire is cut to form the tail portion 72. The mold compound 37 then surrounds the reversed stud bump.

The formation of the interconnect layer 71 is very similar to the processes shown in FIGS. 2-6 above. In FIG. 2, a resin coated copper layer is adhered to a carrier such as a glass carrier using a tape or adhesive. The copper foil or layer is then patterned to form copper pads. In the process for forming this alternative embodiment, the copper pads are then used to receive a reversed stud bump such as 73 in FIG. 8 using a capillary bonding tool. The capillary tool dispenses bond wire as it is moved away from the stud that it places on the copper pad. This wire becomes vertical tail 72 in FIG. 8. The AP 42 is then die attach mounted generally as shown in FIG. 3 above, and mold compound 37 is formed around the wires, reversed stud bumps 73 and AP 42. The remaining steps of FIGS. 3-6 such as grinding the mold compound, forming a first RDL over the wires and the AP 42, forming solder bumps or C4 connectors on the RDL, demounting the layer 71 from the carrier, mounting it at the top surface to a second carrier, grinding the resin layer to expose the copper pads, and forming the second RDL layer, and mounting it to a lower package substrate, are all performed as described above and are not repeated here.

This embodiment PoP structure 70 with the reversed stud bump and wire TVAs shown in FIG. 8 requires care in the stud bumping process, as the wire tails 72 may otherwise become dislocated or lose alignment during the process. This may occur during compression molding to form mold compound 37, or during the die attach of the AP 42. This is due to an effect known as "wire swift" where the very fine bond wires move during processing or molding. The stacked reversed stud bump embodiment such as in FIG. 1 may be less subject to the effects of possible wire swift. Both embodiments provide a fine pitch through via connection for use as an interconnect layer in a PoP structure.

Figure 9:
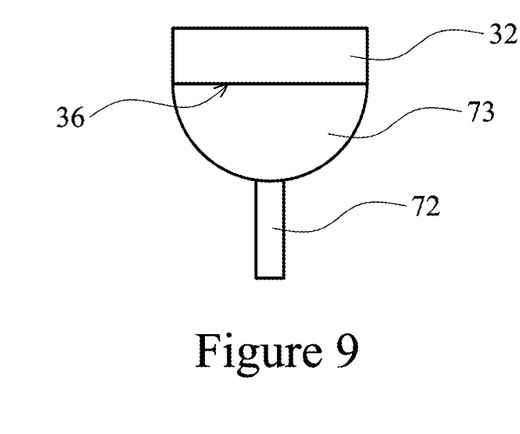
FIG. 9 depicts in a cross-sectional view a through via assembly of the embodiment of FIG. 8.

FIG. 9 depicts the reversed stud bump 73 and wire tail 72 in a detailed cross-sectional view. In this figure, a single TVA is shown. Pad 32 may again include a finish plating 36 as described above which may include nickel, nickel-palladium, gold, nickel-gold, silver, ENEG, ENEPIG and other known finish platings. Again, if resin coated carrier 30 is used with an aluminum coating, then the finish treatment is not required, as the pads 32 will be formed of aluminum, instead of copper. The reversed stud bump 73 is formed, for example, using a capillary tool as for wire bonding with copper or gold wire. After a ball is formed at the end of the bond wire, the tool mechanically mounts and deforms the ball onto pad 32, forming a stud. However, in this example embodiment, the tool allows the wire to remain attached to the stud as the tool is retracted, forming the wire "tail" 72 as shown in FIG. 9. This reversed stud bump and wire arrangement then forms the TVA that extends through the interconnection layer.

Figure 10:
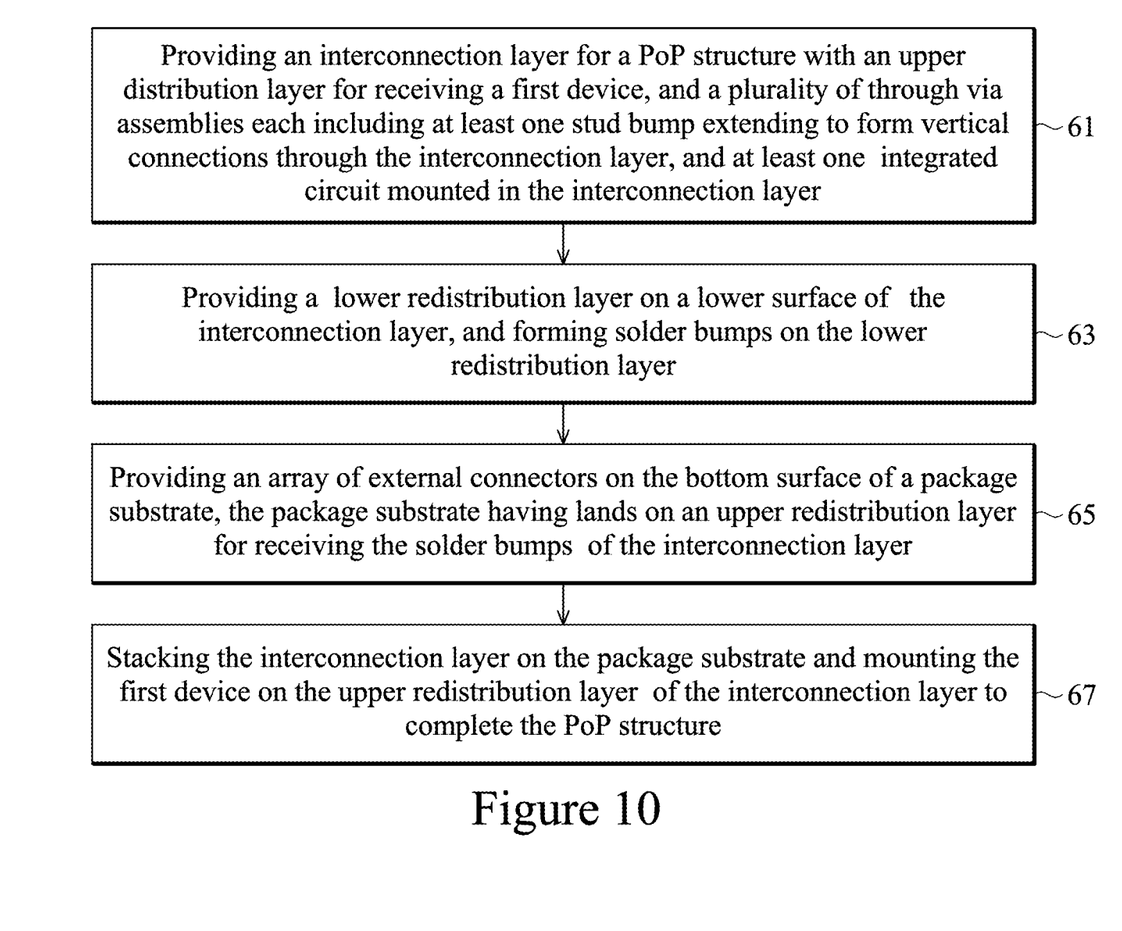
FIG. 10 depicts in a flow diagram a method embodiment.

FIG. 10 depicts in a flow diagram a method for forming a PoP structure of the embodiments. At step 61, an interconnection layer is provided with an upper redistribution layer for receiving an integrated circuit device. A plurality of TVAs each including at least one stud bump is provided to form vertical connections through the interconnection layer, and at least one integrated circuit is mounted in the interconnection layer. In step 63, a lower redistribution layer is formed on the lower surface of the interconnection layer, and connectors such as solder bumps are formed on the lower redistribution layer.

In step 65, an array of external connectors are provided on the bottom surface of a package substrate, and lands on the upper surface are provided for receiving the solder bump connectors of the interconnection layer.

In step 67, a PoP structure is formed by stacking the interconnection layer on the package substrate. A first device is mounted on the upper redistribution layer of the interconnection layer to complete the PoP structure.

Figure 11:
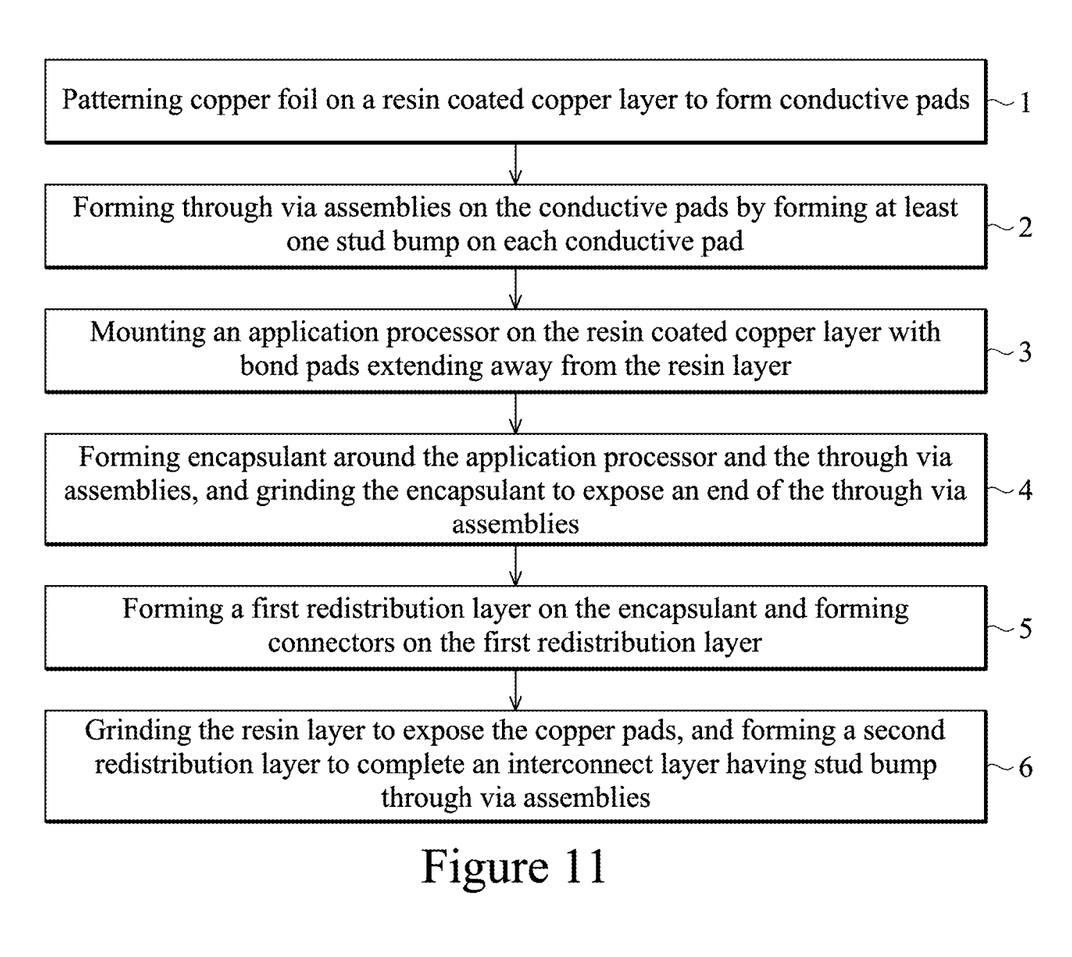
FIG. 11 depicts in a flow diagram an alternative method embodiment.

FIG. 11 depicts in a flow diagram a method for making the interconnection layer having the stud bump through via assemblies. In step 1, a copper foil is patterned on a resin coated copper layer to form conductive pads. In step 2, the through via assemblies are formed by forming at least one reversed stud bump on each conductive pad. In step 3, an application processor is mounted on the resin coated copper layer with bond pads extending away from the resin layer. In step 4, an encapsulant is formed around the application processor and the through via assemblies, and the encapsulant is ground to expose an end of the through via assemblies. In step 5, a first redistribution layer is formed on the encapsulant, and connectors are formed on the first redistribution layer. In step 6, a grinding step is performed on the resin to expose the copper pads, and a second redistribution layer is formed to complete the interconnect layer having stud bump through via assemblies.

Use of the embodiments provides a low cost interconnection layer with through via assemblies for use in PoP structures, enabling thinner packages and supporting wide I/O devices with many connections, which conventional PoP structures cannot support.

In an example embodiment, a semiconductor device structure includes a package on package interconnect layer including an upper redistribution layer configured for receiving a first integrated circuit device and comprising a lower redistribution layer having connectors for mounting to a lower package; a plurality of through via assemblies extending vertically through the package on package interconnect layer, each of the through via assemblies including at least one reversed stud bump on a conductive pad, the through via assemblies electrically coupled to conductors in the upper redistribution layer at an upper end and to conductors in the lower redistribution layer at a lower end of each through via assembly; at least one application processor integrated circuit mounted in the interconnect layer; a lower package including a substrate having pads on an upper surface receiving the connectors of the interconnect layer and having a plurality of external connectors on a lower surface of the substrate for coupling to a circuit board; and a first integrated circuit device mounted on the upper redistribution layer of the interconnect layer and having at least some terminals coupled to the at least one application processor integrated circuit.

In a further embodiment, the semiconductor device structure is provided and the through via assemblies of the interconnect layer each further include a stack of reversed stud bumps on the conductive pad. In still another embodiment, the through via assemblies of the interconnect layer each further include a bond wire extending from the stud bump on the conductive pad.

In yet another embodiment, in the semiconductor device structure, the connectors comprise solder. In still a further embodiment, the plurality of external connectors comprises solder. In another embodiment, in the semiconductor device structure the interconnect layer further includes a layer of encapsulant surrounding the through via assemblies and the at least one application processor integrated circuit. In yet a further embodiment, the first integrated circuit device in the semiconductor device structure is a memory device. In another embodiment, the first integrated circuit device is a memory module of a plurality of memory integrated circuits. In still a further embodiment, the semiconductor device structure is provided wherein the at least one application processor integrated circuit is a microprocessor.

In still another embodiment, the semiconductor device structure is provided wherein the external connectors number greater than one thousand.

In an embodiment, a semiconductor device structure includes a package on package interconnection layer comprising a first redistribution layer on an upper surface of the interconnection layer having lands configured for receiving at least one integrated circuit device and a plurality of through via assemblies each including a reversed stud bump stack formed on a conductive pad that is coupled to the first redistribution layer, the through via assemblies extending through an encapsulant in the interconnect layer, and a second redistribution layer on a lower surface of the package on package interconnection layer, the second redistribution layer having connectors extending from the package on package interconnection layer and coupled to the through via assemblies; at least one application processor mounted in the package on package interconnection layer; and a lower package including a substrate and a plurality of lands on an upper surface of the substrate coupled to the connectors, and further including a plurality of external connectors extending from a bottom surface of the lower package; wherein at least some of the external connectors are electrically coupled to the at least one application processor.

In yet another embodiment, in the semiconductor device structure the connectors of the package on package interconnection layer comprise solder. In a further embodiment, the semiconductor device structure is provided wherein the plurality of through via assemblies further includes a stack of reversed copper stud bumps formed on each of the conductive pads. In still a further embodiment, the semiconductor device structure is provided wherein the external connectors number greater than one thousand.

In a method embodiment, the steps include patterning conductor material coating an insulator layer attached to a first carrier to form conductive pads on the insulating layer; forming through via assemblies by disposing at least one reversed stud bump on each of the conductive pads on the insulating layer; mounting at least one application processor integrated circuit on the insulating layer; forming an encapsulant surrounding the through via assemblies and the application processor integrated circuit, the through via assemblies extending vertically through the insulating layer; grinding the encapsulant to expose a first end of each of the through via assemblies at a surface of the encapsulant; forming a first redistribution layer on the surface of the encapsulant, the first redistribution layer including conductors coupled to the through via assemblies; disposing connectors on the first redistribution layer coupled to the through via assemblies by the conductors in the first redistribution layer; removing the first carrier from the insulating layer; grinding the insulating layer to expose at least a portion of the conductive pads coupled to a second end of each of the through via assemblies; and forming a second redistribution layer over the exposed portion of the conductive pads, the second redistribution layer comprising conductors coupled to the through via assemblies.

In still a further embodiment, the above method further includes forming through via assemblies by disposing at least one reversed stud bump on each of the conductive pads on the insulating layer further includes forming a stack of stud bumps on the conductive pads. In yet another embodiment, the above methods further include forming the stack of reversed stud bumps includes forming a stack of copper stud bumps using a capillary wire bonding tool. In yet another embodiment, forming through via assemblies by disposing at least one reversed stud bump on each of the conductive pads on the insulating layer further includes forming a stud bump and a bond wire extending from the stud bump using copper wire in a capillary bonding tool. In still a further embodiment, the above methods include mounting the connectors to an upper surface of a lower package substrate which further comprises external connectors on a lower surface, at least one of the external connectors electrically coupled to the at least one application processor. In yet another embodiment, the above methods include mounting an integrated circuit device to the second redistribution layer to form a package on package structure.

The scope of the present application is not intended to be limited to the particular illustrative embodiments of the structures, methods and steps described in the specification. As one of ordinary skill in the art will readily appreciate from the disclosure of the example embodiments, processes, or steps, presently existing or later to be developed, that perform substantially the same function or achieve substantially the same result as the corresponding embodiments described herein may be utilized and these alternatives are contemplated as part of the embodiments. Accordingly, the appended claims are intended to include within their scope such processes or steps.

What is claimed is:

1. A method of packaging a device, the method comprising:
    forming a contact pad;
    forming at least one stud bump on a first surface of the contact pad, wherein forming the at least one stud bump comprises stacking at least two stud bumps on the contact pad;
    forming a molding compound around the at least one stud bump, wherein a surface of the at least one stud bump is coplanar with a surface of the molding compound;
    forming a first redistribution layer on the at least one stud bump and the molding compound; and
    forming a second redistribution layer on a second surface of the contact pad, the second surface being opposite the first surface.

2. The method of claim 1, wherein the forming the contact pad comprises forming the contact pad on a carrier substrate, and further comprising removing the carrier substrate prior to the forming the second redistribution layer.

3. The method of claim 1, wherein forming the at least one stud bump comprises:
    forming a ball at an end of a first wire;
    mounting the ball onto the contact pad to form a base region of the at least one stud bump; and
    cutting the first wire above the ball to form a tail region of the at least one stud bump.

4. The method of claim 3, wherein forming the at least one stud bump further comprises:
    forming a second ball at an end of a second wire;
    mounting the second ball onto the tail region of the at least one stud bump to form a second base region; and
    cutting the second wire above the second base region to form a second tail region.

5. The method of claim 4, wherein the first wire and the second wire are a same wire.

6. The method of claim 1, further comprising electrically connecting at least one first integrated circuit to the first redistribution layer and electrically connecting at least one second integrated circuit to the second redistribution layer.

7. The method of claim 1, wherein the second redistribution layer is formed after forming the first redistribution layer.

8. A method of packaging a device, the method comprising:
    forming a first contact pad on a carrier substrate;
    forming a stud bump on the first contact pad;
    placing a first surface of an integrated circuit die on the carrier substrate, the integrated circuit die having second contact pads on a second surface;
    forming a molding compound interposed between and over the stud bump and the integrated circuit die;
    exposing the stud bump and second contact pads of the integrated circuit die; and
    forming a first redistribution layer on the stud bump, the second contact pads, and the molding compound.

9. The method of claim 8, wherein the exposing comprises grinding the molding compound to expose the stud bump.

10. The method of claim 8, further comprising removing the carrier substrate and forming a second redistribution layer on the first contact pad, wherein the first contact pad is interposed between the first redistribution layer and the second redistribution layer.

11. The method of claim 10, further comprising, prior to the removing the carrier substrate, attaching another carrier substrate over the first redistribution layer.

12. The method of claim 10, wherein the forming the stud bump comprises stacking at least two stud bumps on the first contact pad.

13. The method of claim 10, wherein the stud bump has a base region and a tail region, the base region being interposed between the tail region and the second redistribution layer.

14. The method of claim 13, wherein a width of the tail region is from about 0.5× to less than 1× a width of the base region.

15. A method of packaging a device, the method comprising:
- forming a first contact pad on a carrier substrate, the first contact pad having a first surface facing the carrier substrate;
- forming a stud bump on a second surface of the first contact pad;
- placing a first surface of an integrated circuit die on the carrier substrate, the integrated circuit die having second contact pads on a second surface;
- forming a molding compound interposed between the stud bump and the integrated circuit die;
- planarizing the molding compound to expose the stud bump and second contact pads of the integrated circuit die;
- forming a first redistribution layer on the stud bump, the second contact pads, and the molding compound;
- removing the carrier substrate; and
- forming a second redistribution layer over the first surface of the first contact pad, the second redistribution layer providing an electrical connection to the first contact pad.

16. The method of claim 15, further comprising, prior to the removing the carrier substrate, attaching another carrier substrate over the first redistribution layer.

17. The method of claim 15, wherein forming the stud bump comprises stacking at least two stud bumps on the first contact pad.

18. The method of claim 15, wherein the stud bump has a base region and a tail region.

19. The method of claim 18, wherein the base region is interposed between the tail region and the second redistribution layer.

20. The method of claim 18, wherein a width of the tail region is from about $0.5\times$ to less than $1\times$ a width of the base region.

* * * * *